MICROMODULE

Filed Aug. 4, 1964

INVENTORS
Warren A. Larson
Alfred Whitman
BY Connolly and Hutz
ATTORNEYS

United States Patent Office 3,311,791
Patented Mar. 28, 1967

3,311,791

MICROMODULE

Warren A. Larson, Pittsfield, and Alfred Whitman, Williamstown, Mass., assignors to Sprague Electric Company, North Adams, Mass., a corporation of Massachusetts Filed Aug. 4, 1964, Ser. No. 387,444
2 Claims. (Cl. 317—101)

This invention relates to an encased circuit component and more particularly to a microelement containing an encased component designed for use in micromodules.

The modular technique has been developed as a preferred form of electrical circuit construction. One form of module consists of a plurality of wafers or plates arranged in parallel planes and held fixed by means of conductive risers, soldered to peripheral notches in said wafers or plates. The purpose of the plates is to provide surfaces on which to accommodate electrical components, and the conductive risers are to afford conductors to interconnect the same with the conductors on adjacent planes. The completed module is then secured to a circuit panel in any convenient manner.

This invention is primarily concerned with one of the individual elements of the above-discussed module, and primarily with a box-like form, adapted to have an electrical component potted therein.

It is an object of this invention to provide an improved microelement construction.

Another object is to provide a microelement construction more uniform than prior art constructions.

These and other objects and advantages of the present invention will be made obvious to those skilled in the art by the following description when considered in relation to the accompanying drawing of which:

The present invention improves upon the above-discussed wafers or plates to which components are affixed by employing a nonconducting box-like form, adapted to have an electrical component, e.g. a capacitor, potted therein, said potted component being affixed to a nonconductive substrate by soldering the leads to land areas adjacent to and in electrical communication with peripheral notches therein.

Figure 1:
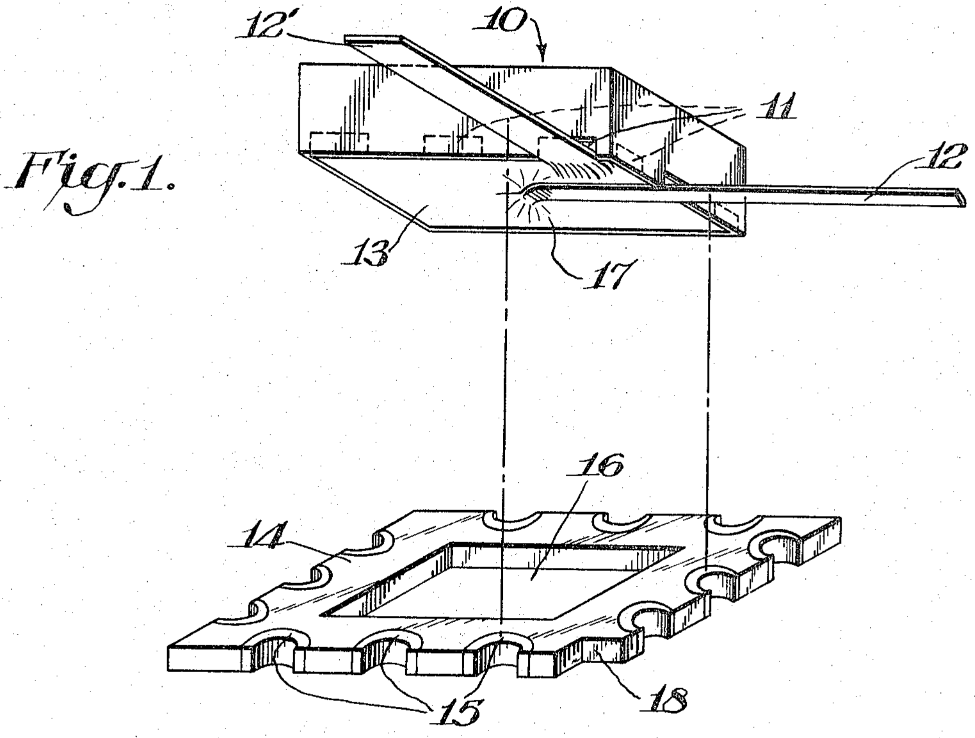
FIGURE 1 is an exploded view in perspective of the inventive unit prior to soldering and cropping of the leads.

Referring to the drawing, FIGURE 1 shows a plastic or resin box-shaped form 10 having comparatively weak breakaway areas 11 adapted to accommodate component anode and cathode leads 12 and 12'. The leads are attached to an electrical component, e.g. a capacitor, which is not shown. The component is potted within form 10 by means of a potting material 13, e.g. a resin or plastic. A microelement substrate 14 is adapted to receive the potted component on the surface thereof where leads 12 and 12' will be soldered to "tinned" peripheral land areas 15 which are in electrical communication with peripheral notches **15*a*. The leads will be cropped or trimmed before attachment to the substrate. The microelement substrate 14 has an open center 16 to accommodate the cathode bulge 17 at the point where the cathode lead emerges from the potting material. After the potted component is soldered to the substrate, the open center 16 will be filled with an appropriate plastic or resin material to insulate and protect the cathode lead and aid in bonding the box-shaped form subassembly to the wafer substrate. It will be noted that substrate 14 has an index notch 18 located at one of the corners thereof. Numbering peripheral notches 15*a* clockwise from this notch, numbers 1 and 2** have been agreed upon as the anode termination points.

Figure 2:
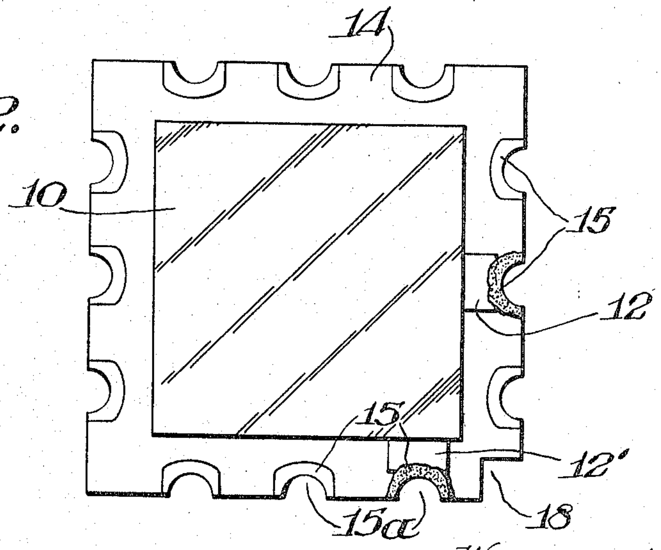
FIGURE 2 is a plan view of the completed unit.

FIGURE 2 shows the completed unit, wherein the electrical component is firmly potted within the box-shaped form and the component leads are soldered to the ceramic substrate.

More particularly, the invention is directed to a microelement assembly comprising a thin nonconductive substrate, e.g. of alumina, having a pair of closely spaced planar surfaces. The wafer has a plurality of peripherally located tinned notches and land areas, e.g. three on an edge. By "tinned" is meant that the notches and land areas are metallized so as to facilitate the soldering of leads thereto. The metal may be solder, silver, copper, etc. The wafer also has a centrally located opening therein. This opening is to accommodate a bulge in the potting material where the cathode lead emerges, as shown at 17 in the drawing.

Positioned on the nonconducting substrate is a microelement subassembly comprising an electrical component, e.g. capacitor, resistor, etc., potted within a nonconducting box-shaped form. The potting material can be any of the prior art potting materials, e.g. epoxy, phenol formaldehyde, etc. The box-shaped form can also be of a variety of nonconducting materials, e.g. Bakelite, epoxy, polyethylene, etc. The form has a plurality of comparatively weak, breakaway areas located in the sides thereof. These correspond in number to the notches in the wafer substrate. The breakaway areas are conveniently provided for by molding the form with thinned areas in the sides or by scoring the sides to preweaken the desired areas.

The anode lead from the component emerges from the potting material at a point near one of the sides of said form and extends through said side at a point where one of the breakaway areas has been removed. A cathode lead emerges from the potting material at a point about equidistant from the sides of the form. This centrally emerging lead permits universal cathode termination to the wafer substrate. This means that when the anode lead is positioned so as to be terminated to either notch number 1 or 2, which is more or less standard practice (clockwise numbering of the substrate notches relative to the index notch 18) the centrally emerging cathode lead can later be conveniently terminated to any notch from 3 to say 12 according to the customer's specification. By having the cathode lead emerge from the center of the potting material, a comparatively small inventory of microelements need only be kept on hand. An undesirable alternative would be to carry no inventory of subassemblies and wait until the customer specifies his termination notches and then bring the cathode out of the potting material at a point closest this notch. This would cause delays in order filling and sporadic work schedules. Another undesirable alternative would be to always maintain a given number of completed microelements, cathode terminated at different notches. The disadvantage being that some of these units may never be called for.

The potting material fills the box-shaped form to an extent short of completely, by a distance about equal to the thickness of the cathode lead. Thus, with another breakaway area removed to accommodate the cathode lead, the form will fit flush against the substrate. The cathode lead is then soldered to its designated land area. It is to be understood that the point of lead soldering is not actually in the notches but on the planar surface (land area) just adjacent the notches, so as not to interfere with the conducting risers which afford electrical communication between modules and the rest of a circuit. After soldering the anode and cathode leads, the opening in the substrate is filled with additional potting material which insulates and protects the exposed cathode lead and also aids in bonding the subassembly to the wafer.

By potting the electrical component in a comparatively inexpensive box-shaped form, the unit can be tested and aged prior to mounting on the comparatively expensive ceramic substrate. Thus, in case of failure, the expensive ceramic substrate is not lost. Moreover, use of the box-shaped form results in completed units which are exceptionally uniform. Because of the flat, parallel surfaces a plurality of different components can be stacked and accurately aligned for interconnection by means of conductive risers. Moreover, the uniformity of the box-like form permits the use of jigs and assembly line techniques.

As is evident from the foregoing, the invention is not to be limited to formation of the rather specific illustrative device. Modifications and variations, as well as the substitutions of equivalents may be made without departing from the spirit of the invention as defined in the appended claims.

What is claimed is:

1. A microelement comprising a thin nonconducting substrate having a pair of closely spaced parallel planar surfaces, a plurality of peripherally located tinned notches and a centrally located opening therein; said tinned notches have tinned land areas adjacent to and in electrical communication therewith; positioned on said wafer is a microelement subassembly comprising an electrical component potted within a nonconducting box-shaped form, said form having a plurality of comparatively weak, breakaway areas in the sides thereof; an anode lead emerging from the potting material at a point near one of the sides of said form and extending through said side at a point where one of said breakaway areas has been removed; a cathode lead emerging from said potting material at a point about equidistant from the sides of said form, said potting material filling said form to an extent short of completely, by a distance about equal to the thickness of the cathode lead, said cathode lead extending through a side of said form at a point where another of said breakaway areas has been removed; each of said leads being soldered to one of said tinned land areas; additional potting material filling said centrally located opening in said wafer so as to insulate and protect the exposed cathode lead and also aid in bonding said subassembly to said wafer.

2. A microelement comprising a thin nonconducting substrate having a pair of closely spaced parallel planar surfaces, a plurality of peripherally located tinned notches and a centrally located opening therein; a microelement subassembly bonded to said substrate so as to cover said centrally located opening, said subassembly comprising an electrical component potted within a nonconducting, box-shaped form, said form having a plurality of comparatively weak lead-accommodating breakaway areas in the sides thereof, an anode lead emerging from the potting material at a point near one of the sides of said form and extending through said side at a point where one of said breakaway areas has been removed, a cathode lead emerging from said potting material at a point about equidistant from the sides of said form, said potting material filling said form to an extent short of completely, by a distance about equal to the thickness of the cathode lead.

References Cited by the Examiner

UNITED STATES PATENTS

| | | | |
|---|---|---|---|
| 2,804,581 | 8/1957 | Lichtgarn. | |
| 3,124,721 | 3/1964 | Rayburn et al. | 317—101 |
| 3,151,210 | 9/1964 | Hennessey | 174—52 X |
| 3,234,320 | 2/1966 | Wong. | |

OTHER REFERENCES

Keonjain, Microelectronics, McGraw-Hill, N.Y., 1963, pp. 166 and 167.

LEWIS H. MYERS, *Primary Examiner.*

D. L. CLAY, *Examiner.*